United States Patent [19]

de La Chapelle et al.

[11] Patent Number: 5,029,240

[45] Date of Patent: Jul. 2, 1991

[54] ELECTRONICALLY TUNEABLE FIBER-OPTIC RECEIVER FOR NARROW BAND MICROWAVE SIGNAL RECEPTION

[75] Inventors: Michael de La Chapelle; Hui-Pin Hsu, both of Canoga Park, Calif.

[73] Assignee: Hughes Aircraft Company, Los Angeles, Calif.

[21] Appl. No.: 371,567

[22] Filed: Jun. 26, 1989

Related U.S. Application Data

[63] Continuation of Ser. No. 948,161, Dec. 31, 1986, abandoned.

[51] Int. Cl.⁵ .............................................. H04B 10/06
[52] U.S. Cl. ...................................... 455/619; 330/308
[58] Field of Search ................... 455/619, 602; 330/59, 330/305, 308; 250/214 A; 372/20

[56] References Cited

U.S. PATENT DOCUMENTS

| | | | |
|---|---|---|---|
| 3,976,873 | 8/1976 | Bottka | 455/619 |
| 4,127,831 | 11/1978 | Riblet | 333/113 |
| 4,295,225 | 10/1981 | Pan | 455/601 |

*Primary Examiner*—Reinhard J. Eisenzopf
*Assistant Examiner*—L. Van Beek
*Attorney, Agent, or Firm*—C. D. Brown; R. M. Heald; W. K. Denson-Low

[57] ABSTRACT

The optical receiver has a photodiode (10) which is reverse biased by a voltage supply (14). The voltage supply provides a variable bias voltage determined by a control unit (16) and the photodiode is matched to the load (22) by an impedance matching circuit (12). The photodiode exhibits large capacitance changes over a range of bias voltages and may be implemented using a Schottky barrier or P+N photodiode. By changing the bias voltage, the photodiode capacitance changes to vary the tuned frequency of the receiver. The matching circuit cancels the reactive component of the photodiode impedance and matches the resistive component to the load. The photodiode may have a doping profile in which an intrinsic or lightly doped region of width greater than the average photon penetration depth is located next to the junction. After the intrinsic region, the doping profile may be selected to achieve linear tuning. This doping profile gives linear tuning without sacrificing photodiode conversion efficiency.

11 Claims, 4 Drawing Sheets

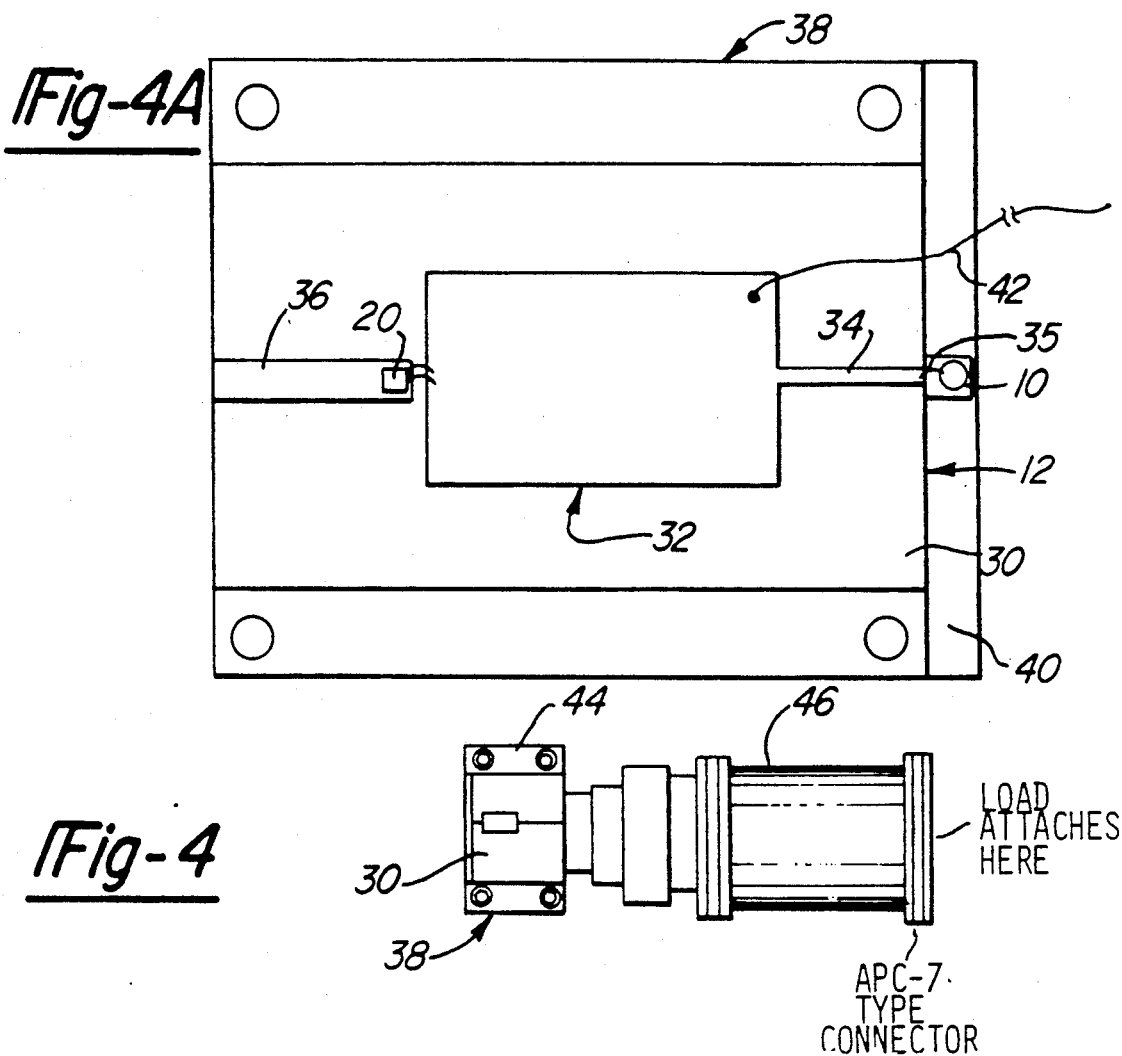
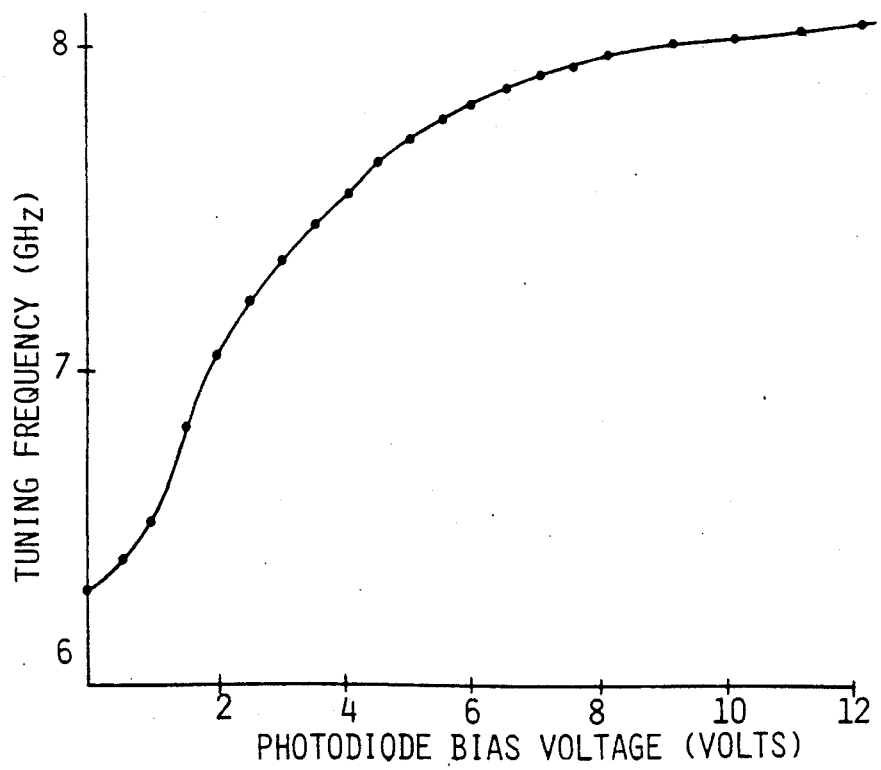

ELECTRONICALLY TUNEABLE FIBER-OPTIC RECEIVER FOR NARROW BAND MICROWAVE SIGNAL RECEPTION

This is a continuation of application Ser. No. 06/948,161, filed Dec. 31, 1986, now abandoned.

SUMMARY OF THE INVENTION

The present invention provides a tuneable fiber optic receiver for narrow band radio frequency (RF), microwave or millimeter wave MMW signal reception. The invention is capable of demonstrating an electronically tuneable bandwidth of at least 25 percent with a 9 dB reduction in fiber optic link loss over a narrow bandwidth at Xband microwave frequencies when compared to the performance of the best available broad band fiber optic receiver. The center frequency of the fiber optic receiver can be rapidly tuned from one frequency to another on the order of 10 nS.

The fiber optic receiver employs a photodiode which is electronically tuneable by varying the reverse bias voltage. The photodiode impedance is matched to the receiver input circuit impedance (nominally 50 ohms) over a narrow bandwidth using a matching circuit. Changes in the bias voltage to the photodiode cause the depletion capacitance of the photodiode to vary. The change in reactance of the photodiode with bias voltage causes the center frequency of operation to shift. By virtue of its rapid tuneability, the receiver demonstrates a large effective bandwidth even though the actual bandwidth of the circuit is inherently narrow.

For a more complete understanding of the invention, its objects and advantages, reference may be had to the following specification and to the accompanying drawings.

BRIEF DESCRIPTION OF THE DRAWINGS

FIGS. 4 and 4A illustrate a microstrip embodiment of the impedance matching circuit of the invention;

FIG. 5 is a graph depicting tuning frequency as a function of photodiode bias voltage, useful in understanding the operation of the invention;

DESCRIPTION OF THE PREFERRED EMBODIMENT

Figure 1:
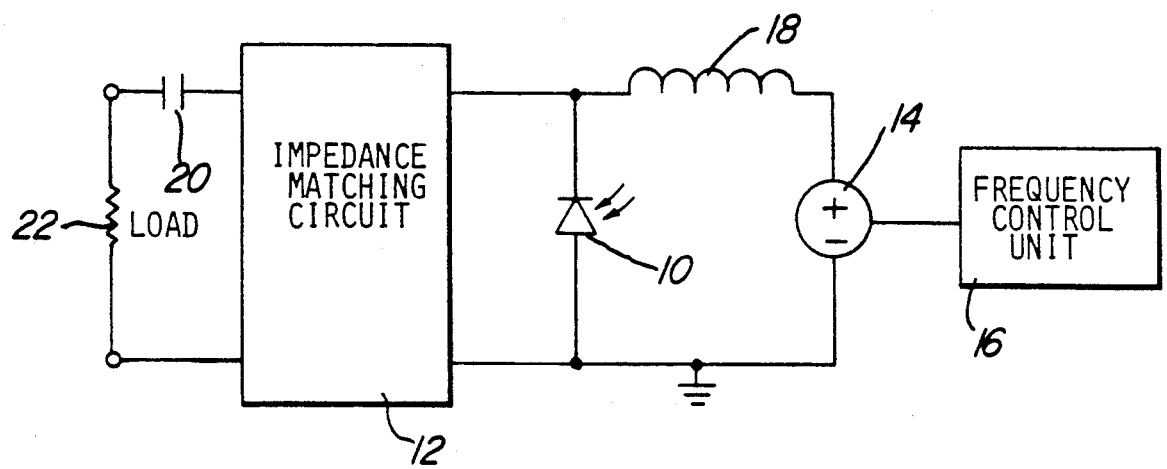
FIG. 1 is a schematic diagram of the fiber optic receiver of the invention.

The fiber optic (OF) receiver of the invention comprises a photodiode 10 connected to an impedance matching circuit 12, as shown in FIG. 1. A power supply 14 is used to reverse bias and electronically tune the photodiode. The output voltage from power supply 14 is controlled by a frequency control unit 16, which sets the necessary bias voltage to tune the receiver to the desired frequency. Preferably photodiode 10 exhibits large capacitance changes over a reasonable range of bias voltages. For this reason, a Schottky barrier photodiode is used. The Schottky barrier photodiode has a voltage variable capacitance in the range from 0 to 12 volts. While the Schottky barrier photodiode is presently preferred, other photodiodes which do not fully deplete for small bias voltages may be used.

The DC bias circuitry comprising power supply 14 and frequency control unit 16 is isolated from the microwave circuitry by a large inductor 18. Similarly, the DC bias voltage is isolated from the load 22 by a large capacitor 20. The matching circuit 12 matches the impedance of the photodiode to the impedance of the load (nominally 50 ohms).

Figure 2:
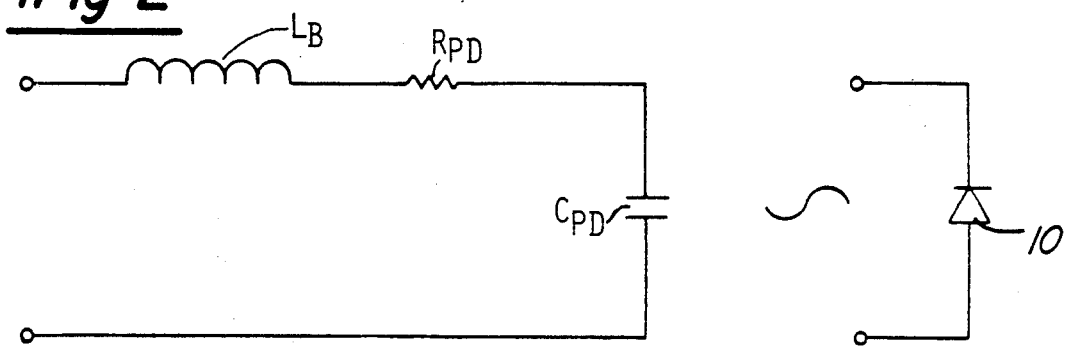
FIG. 2 is a schematic RF equivalent circuit model of the photodiode of the invention.

The RF equivalent circuit model of a typical photodiode derived from measured S-parameters is shown in FIG. 2. The series resistor, $R_{PD}$ represents the contact resistance of the photodiode. $L_B$ is the inductance of the bond wire connecting the photodiode to the circuit. The capacitance, $C_{PD}$ is a result of the depletion of the reverse-biased photodiode and is a function of the reverse voltage. The change in capacitance $C_{PD}$ with voltage gives rise to the tuning effect.

Figure 3:
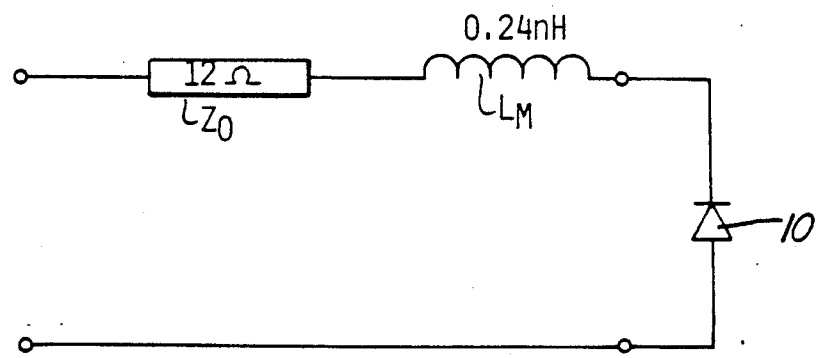
FIG. 3 is a schematic diagram of the impedance matching circuit of the invention.

The photodiode impedance can be matched about a narrow frequency band by connecting a series inductor and quarter-wavelength transformer $Z_0$ as shown in FIG. 3. The value of the matching inductor $L_M$ is chosen to resonate the shunt capacitance of the photodiode at a specified frequency $\omega_0$.

$$L_M = 1/(\omega_0^2 C_{PD}) - L_B \qquad (1)$$

The matching inductor cancels the reactance of the photodiode. A quarter-wavelength transformer is then used to transform the photodiode resistance $R_{PD}$ to the load impedance $R_L$ (50 ohms). The impedance of the quarterwavelength transformer is, $$Z_0 = \sqrt{R_{PD} R_L} \qquad (2)$$

This simple two-element impedance matching circuit matches the photodiode to the load over a narrow bandwidth. There are numerous other matching circuits which work equally well. A wider bandwidth match can be obtained by employing more elements in the matching circuit.

A photodiode receiver using the two-element impedance matching circuit of FIG. 3 may be implemented as follows. The matching circuit may be a 0.24 nH inductor in series with a 12 ohm quarter-wave transformer. The circuit may be realized using microstrip elements as illustrated in FIG. 4. In order to fabricate the very low impedance of the transformer, a 10 mil thick alumina substrate 30, or the like, may be used. The microstrip matching circuit 12 comprises quarter-wavelength transformer 32 and distributed matching inductor 34 in series with photodiode 10. The impedance matching circuit 12 is connected to DC isolation capacitor 20 and 50 ohm transmission line 36 as illustrated.

The microstrip matching circuit is mounted on a metal carrier 38 which has a rib 40 along the edge. See FIG. 4. Photodiode 10 is mounted to the rib to provide ground to the backside of the photodiode device. The photodiode in turn is connected to the matching circuit using a bond wire 35 whose length is minimized to reduce parasitic inductance.

The photodiode is reverse biased using a DC voltage supply which is connected to the device via a long bond wire 42. The long bond wire has enough inductance to isolate the DC supply circuit from the microwave matching circuit. Capacitor 20 is a large capacitor (low reactance) which is used to isolate the DC bias from the load which is connected to transmission line 36. The isolation inductor, comprising long bond wire 42, and the capacitor 20 together form a common "bias T."

The metal carrier 38, containing the fiber optic receiver circuit, is attached to a metal block 44. A coax to microstrip transition 46 may be mounted to block 44 to provide a convenient connection to the fiber optic receiver. In the embodiment illustrated, the receiver, excluding the metal block and coax to microstrip transition, occupies a volume of less than $\frac{1}{4}'' \times \frac{1}{4}'' \times \frac{1}{8}''$. For this reason and others, this invention is particularly useful for airborne applications where size and weight are critical.

The center frequency $\omega_0$ at which the photodiode is impedance matched can be shifted by varying the reverse bias voltage V. The equations describing the frequency tuning of an abrupt P+N or metal-semiconductor diode with constant doping $N_D$ are:

$$\omega_0 = 1/[(L_M - L_B)C_{PD}]^{\frac{1}{2}} \quad (3)$$

$$C_{PD} = \sqrt{\frac{q \epsilon_S N_D}{2\left(V_{bi} - V - \frac{kT}{q}\right)}} \quad (4)$$

where:

| | | | | |
|---|---|---|---|---|
| $N_D$ | = | donor impurity density | $T$ | = temperature |
| $V_{bi}$ | = | built in potential | $k$ | = Boltzmann's constant |
| $q$ | = | electron charge | $\epsilon_S$ | = dielectric constant |

The depletion capacitance of the photodiode decreases with reverse bias voltage until the device punches through or goes into avalanche breakdown. In this respect, the photodiode of the preferred embodiment differs from PIN photodiodes which are conventionally used in fiber optic receivers. With PIN photodiodes the intrinsic semiconductor material punches through or depletes to the N+ contact for very small voltages. The present invention thus is preferably implemented with Schottky photodiodes which exhibit a large capacitance variation for reverse bias voltages (in this case from 0 to 12 volts). Beyond 12 volts the photodiode is punched through and has no capacitance change.

The return loss or VSWR measured from the load port of the OF receiver indicates how well the photodiode is matched to the load impedance (50 ohms). The return loss peaks at the frequency where the depletion capacitance $C_{PD}$ resonates with the sum of the matching inductance and bond wire inductance, $L_M + L_B$. A plot of frequency of peak return loss $\omega_0$ versus reverse bias voltage to the photodiode is shown in FIG. 5. Note that the frequency increases with reverse bias voltage in accordance with equations (3) and (4) above. The curve saturates for large voltages as the photodiode punches through. The invention can be electronically tuned from one frequency to another on the order of 10 nS.

The tuning frequency versus bias voltage plot of FIG. 5 is nonlinear for the exemplary photodiode of constant doping. As will be explained below, a photodiode can be constructed with specially tailored doping profile to yield a linear tuning frequency versus bias voltage curve. This is discussed in connection with FIGS. 8, 9 and 10 below.

Figure 6:
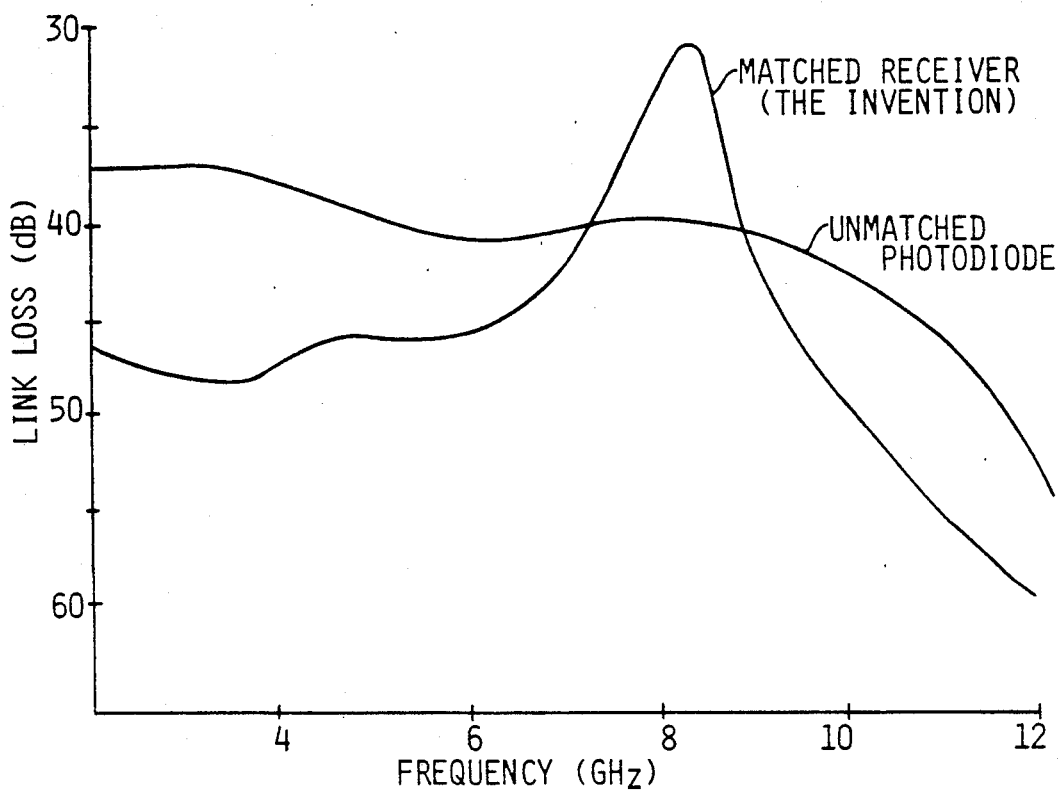
FIG. 6 is a graph comparing link loss due to microwave impedance matching with that of the unmatched photodiode as a function of frequency.

In order to better understand the performance of the invention, the invention may be operated as a receiver in a FO link consisting of a high-speed GaAlAs laser and a single mode fiber. To precisely evaluate the receiver performance improvement due to matching, one can compare the overall link loss of the invention (a matched photodiode) against that of an unmatched photodiode (the exact same photodiode used in the invention). This comparison is shown in FIG. 6. The invention using a matched photodiode gives lower link loss over a bandwidth of 22 percent about the center frequency of 8 GHz. At 8 GHz, the reduction of the link loss over the unmatched receiver is 9 dB.

Figure 7:
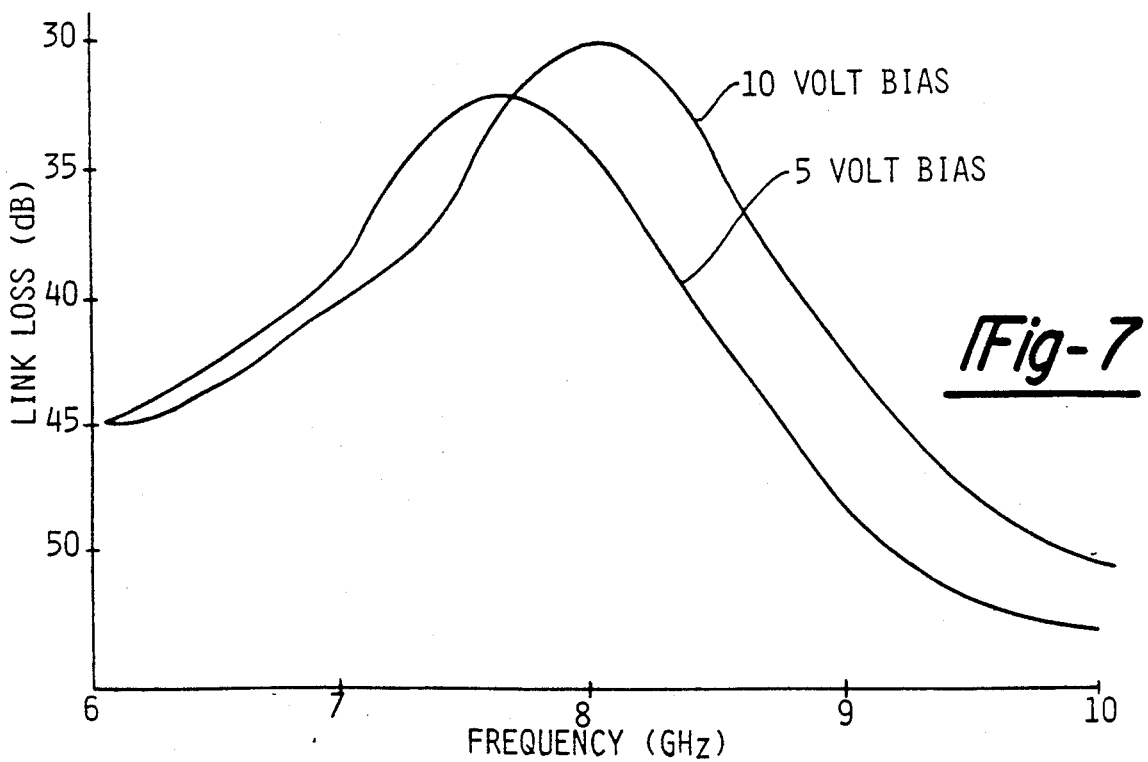
FIG. 7 is a graph of link loss for two different photodiode bias voltages as a function of frequency, demonstrating the tuning feature of the invention.

One significant advantage of the invention is its electronic tuneability. FIG. 7 shows that the link loss response can be peaked at different frequencies by varying the reverse bias to the matched photodiode. The range of tuneability is on the order of 25 percent for bias voltages between 0 volts and 10 volts. There is a slight reduction in the quantum efficiency of the photodiode as the reverse voltage is decreased, which is responsible for the higher link loss for the 5 volt curve in FIG. 7.

Another important advantage of this invention is the potential savings in production costs due to tuneability. If a PIN photodiode is microwave impedance matched to a load, in the manner described above, it will not be electronically tuneable due to its fixed depletion width. It is improbable that the match in the inductor $L_M$ can be precisely fabricated so as to resonate the depletion capacitance of the photodiode at exactly the specified center frequency. In this case, perhaps the only way to tune the center frequency to the specified value is by mechanically bonding tuning chips to the matching circuit. This technique is tedious, time consuming and runs the risk of damaging the circuit.

On the other hand, the present invention provides a means of tuning a OF receiver electronically rather than mechanically. This technique will result in tremendous savings of time and will not endanger the delicate circuitry.

While the foregoing gives a basic understanding of the invention, certain variations are possible. The invention described can also be realized using many different matching circuits consisting of shunt and series inductors, capacitor and transmission lines. It is generally possibly to match over a large bandwidth with more matching elements. However, the wider the bandwidth match of the receiver is, the less the electronic tuning range will be.

Figure 8:
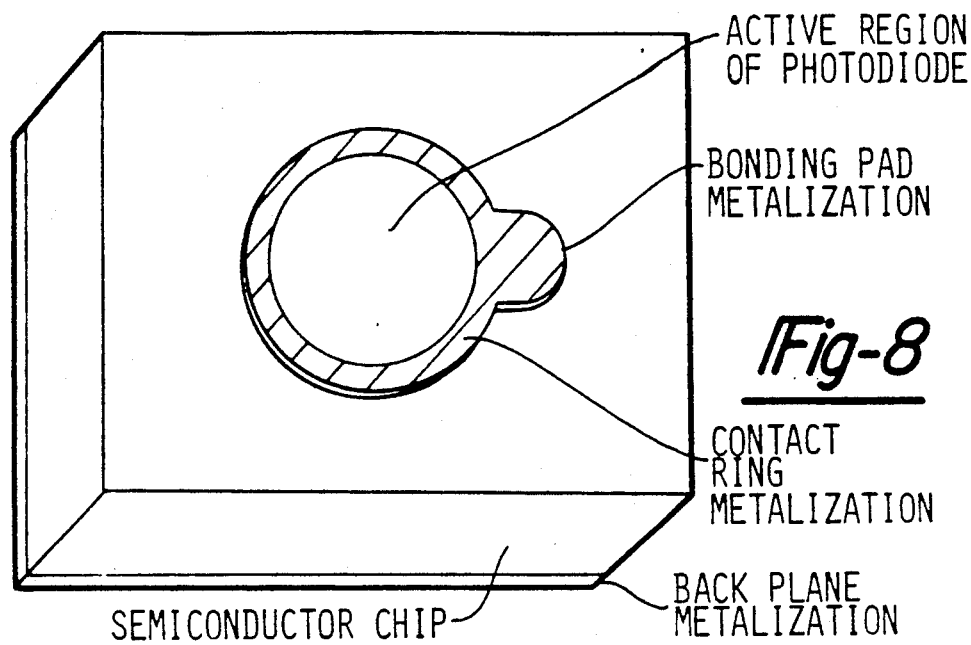
FIG. 8 is a perspective view of a photodiode useable in practicing the invention.
Figure 9:
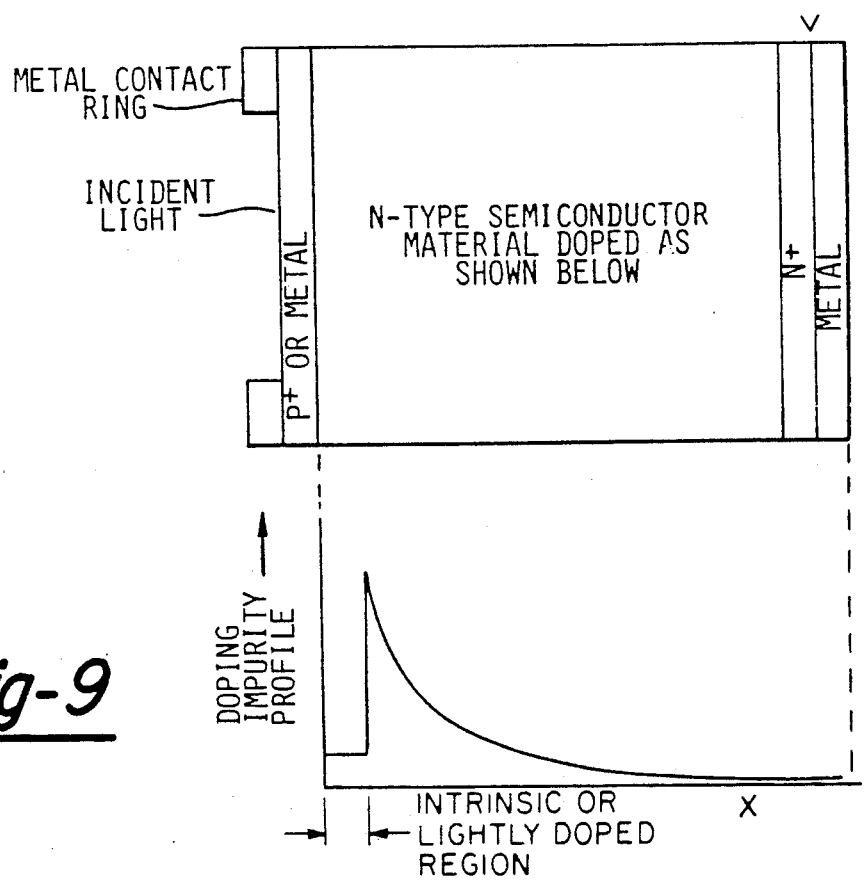
FIG. 9 is a cross-sectional view of the photodiode of FIG. 8, also illustrating a doping impurity profile with respect to the longitudinal axis X which gives linear tuning.
Figure 10:
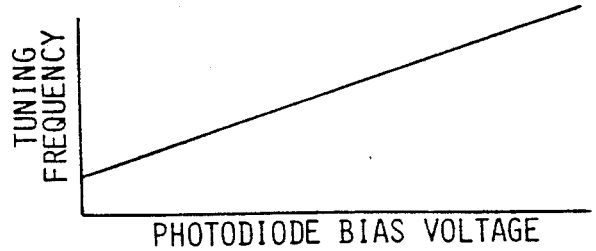
FIG. 10 is a graph showing the resulting linear tuning frequency versus bias voltage for the photodiode of FIGS. 8 and 9.

As stated above, the invention is also capable of improved results by employing a photodiode with specially tailored doping profiles. Such a diode is illustrated in FIGS. 8, 9 and 10. The diode of FIGS. 8, 9 and 10 may be fabricated from a Schottky contact or P+N junction. The doping profile to achieve linear center frequency versus voltage characteristic is of the form, $$N = N_O X^{-3/2}, \text{ for } X > 0 \quad (5)$$

using varactor diode design theory. For a further explanation of this subject, reference may be had to "Physics of Semiconductor Devices" by S. M. Sze, John Wiley and Sons, N.Y., 1969, pages 133-136. This profile has a peak doping concentration of $N_O$ at the junction (x=0) and has a decreasing doping concentration with x, as shown in FIG. 9.

A doping profile of the form of the equation (5) has a very high doping concentration near the junction, causing the depletion width to be small for low reverse bias voltages. This profile creates problems for efficient photodiode operation because incoming photons which ionize atoms outside the depletion region will not contribute to the photocurrent, causing the conversion efficiency of the device to be low. To avoid this problem, the present invention employs a doping profile that has an intrinsic (or lightly doped) region next to the junction, of width greater than the average photon penetration depth for the wavelength of light used. After the intrinsic region, the doping profile of equation (5) is used to achieve linear tuning. The photodiode structure of FIG. 9 gives linear tuning without sacrificing photodiode conversion efficiency. When a small reverse bias voltage is applied to the photodiode of FIG. 9, there is immediate depletion of the intrinsic region. Incoming photons are then ionized within the depleted region even for small reverse bias voltage. As the bias voltage is increased, the photodiode begins to deplete into the profile region described by equation (5) where there is linear tuning.

Although other fabrication processes may be possible, the photodiode of FIG. 9 can be fabricated using vapor phase epitaxy, liquid phase epitaxy or molecular beam epitaxy (MBE).

Photodiodes that have a constant level of doping impurities in the N region, such as the Schottky device emloyed in this invention, exhibit large capacitance changes for small bias voltages. This causes the greatest amount of tuning to occur at lower bias voltages.

From the foregoing, it will be understood that the present invention provides a fiber optic receiver optimized for narrow bandwidth RF or microwave performance. The receiver is electronically tuneable over a wide bandwidth by varying the reverse bias voltage to the photodiode. An impedance matched fiber optic receiver is thus provided which can be optimized for low loss operation over narrow RF or microwave bandwidth. Moreover, the photodiode, with a specially tailored doping profile, gives a linear tuning frequency versus reverse bias voltage characteristic.

While the invention has been thus described in connection with its presently preferred embodiments, it will be understood that the invention is capable of certain modification and change without departing from the scope of the invention as set forth in the appended claims.

What is claimed is:

1. An impedance matched narrow-band optical signal receiver comprising:
   a photodiode having a depletion capacitance which varies as a function of the amount of bias voltage applied thereto, an electronic impedance matching circuit disposed between said photodiode and a load, said electronic impedance matching circuit matching said photodiode to said load over a narrow bandwidth having a center microwave frequency;
   a variable power supply, said variable power supply being connected to said photodiode and providing said bias voltage thereto;
   means for shifting said center microwave frequency of said narrow band receiver over a band of microwave frequencies, said shifting means being connected to said variable power supply and controlling the output thereof to vary the depletion capacitance of the photodiode until it resonates with the impedance matching circuit at the microwave frequency to which the receiver is desired to be tuned.

2. The modulated optical signal receiver as claimed in claim 1 wherein said electronic impedance matching circuit is a two-element circuit having an inductor serially connected with a resistor.

3. The modulated optical signal receiver as claimed in claim 1 wherein said electronic impedance matching circuit includes a matching inductor for substantially cancelling the reactance of said photodiode and a quarter-wavelength transformer for matching the resistance of said photodiode to said load.

4. The modulated optical signal receiver as claimed in claim 1 which further comprises:
   first means for isolating said variable power supply and said center microwave frequency shifting means from microwave signals, said first isolating means being disposed between said variable power supply and said electronic impedance matching circuit.

5. The modulated optical signal receiver as claimed in claim 4 further comprises:
   second means for isolating said load from said bias voltage, said second isolating means being disposed between said electronic impedance matching circuit and said load.

6. The modulated optical signal receiver as claimed in claim 1 wherein said photodiode is a P+N, N+P or Schottky barrier semiconductor photodiode.

7. The modulated optical signal receiver as claimed in claim 1 wherein said photodiode has a doping profile to produce a linear relationship between variations of said bias voltage and the shifting of said center microwave frequency.

8. The modulated optical signal receiver as claimed in claim 1 wherein said photodiode includes a junction and a first region adjacent said junction, said first region being of a width greater than the average photon penetration depth.

9. The modulated optical signal receiver as claimed in claim 8 wherein said first region is an intrinsic semiconductor material.

10. The modulated optical signal receiver as claimed in claim 8 wherein said first region is a lightly doped semiconductor material.

11. The modulated optical signal receiver as claimed in claim 8 wherein said photodiode has an intrinsic region and has a doping profile N in accordance with the following equation:

$$N = N_o X^{-3/1}, \text{ for } X > 0$$

where $N_o$ is the peak doping concentration at x=0 and X is the distance from the end of said intrinsic region.

* * * * *